United States Patent
Jeong et al.

(10) Patent No.: US 8,318,583 B2
(45) Date of Patent: Nov. 27, 2012

(54) METHOD OF FORMING ISOLATION STRUCTURE OF SEMICONDUCTOR DEVICE

(75) Inventors: Yong-Sik Jeong, Suwon-si (KR);
Jeong-Uk Han, Suwon-si (KR);
Weon-Ho Park, Hwaseong-si (KR);
Byung-Sup Shim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 308 days.

(21) Appl. No.: 12/639,035

(22) Filed: Dec. 16, 2009

(65) Prior Publication Data
US 2010/0197109 A1 Aug. 5, 2010

(30) Foreign Application Priority Data
Feb. 2, 2009 (KR) .................. 10-2009-0008123

(51) Int. Cl.
*H01L 21/76* (2006.01)
(52) U.S. Cl. ........ 438/427; 438/405; 438/221; 438/700; 257/E21.214; 257/E21.548; 257/E29.02
(58) Field of Classification Search .................. 438/427; 257/E21.548
See application file for complete search history.

(56) References Cited

U.S. PATENT DOCUMENTS
6,461,934 B2  10/2002  Nishida et al.
2006/0220171 A1  10/2006  Choi et al.

FOREIGN PATENT DOCUMENTS
JP  2000-150634 A  5/2000
KR  10-2004-0050408 A  6/2004
KR  10-0697283 A  10/2006

*Primary Examiner* — Julio J Maldonado
*Assistant Examiner* — Sonya McCall Shepard
(74) *Attorney, Agent, or Firm* — Sughrue Mion, PLLC

(57) ABSTRACT

Provided is a method of forming an isolation structure of a semiconductor device capable of minimizing the number of performing a patterning process and having trenches of various depths. The method includes partially etching the semiconductor substrate using a first patterning process to form first trenches and second trenches having a first depth. The semiconductor substrate has first to third regions. The first trenches are formed in the first region, and the second trenched are formed in the second region. The semiconductor substrate is partially etched using a second patterning process, so that third trenches are formed in the third region, and fourth trenches are formed in the second region. The fourth trenches extend from bottoms of the second trenches. The third trenches have a second depth, and the fourth trenches have a third depth. An isolation layer filling the first to fourth trenches is formed.

14 Claims, 10 Drawing Sheets

METHOD OF FORMING ISOLATION STRUCTURE OF SEMICONDUCTOR DEVICE

CROSS-REFERENCE TO RELATED APPLICATION

This application claims priority from Korean Patent Application No. 10-2009-0008123, filed Feb. 2, 2009, the contents of which are hereby incorporated herein by reference in their entirety.

SUMMARY

Method and apparatuses consistent with the present inventive concept relate to a semiconductor device, and more particularly, to a method of forming an isolation structure of a semiconductor device and a related device.

A semiconductor device includes elements of various sizes formed on a semiconductor substrate. In order to electrically separate such elements from one another, a technique of forming trenches defining active regions in the semiconductor substrate is employed. The trenches are filled with an isolation layer. Meanwhile, such trenches require depths corresponding to electrical characteristics of the elements. That is, the semiconductor substrate requires trenches having different depths. Performing several patterning processes to form trenches having different depths is not advantageous in terms of production efficiency.

Exemplary embodiments provide a method of forming an isolation structure of a semiconductor device which can minimize the number of performing patterning processes and has trenches of various depths.

According to an exemplary embodiment, a method of forming an isolation structure includes partially etching a semiconductor substrate using a first patterning process to form at least one first trench and at least one second trench having a first depth. The semiconductor substrate has a first region, a second region, and a third region. The first trench is formed in the first region, and the second trench is formed in the second region. The semiconductor substrate is partially etched using a second patterning process to form at least one third trench in the third region and at least one fourth trench in the second region. The fourth trench extends from bottoms of a bottom of the second trench. The third trench has a second depth, and the fourth trench has a third depth. An isolation layer filling the first to fourth trenches is formed.

The second trench may have a first bottom surface, and the fourth trench may have a second bottom surface. The first bottom surface and the second bottom may form a step difference. The second bottom surface may be formed at a lower level than bottoms of the first and third trenches.

The first depth may be smaller than the second depth. The first trench may have a smaller width than the third trench, and the second trench may have a greater width than the first trench.

The first patterning process may include: forming a first mask pattern on the semiconductor substrate; and etching the semiconductor substrate using the first mask pattern as an etch mask. The first mask pattern may be formed by sequentially stacking a pad oxide layer and a mask nitride layer.

The second patterning process may include: forming a second mask pattern on the semiconductor substrate and etching the semiconductor substrate using the second mask pattern as an etch mask. The second mask pattern may entirely cover the first trench, partially cover the second trench, expose a part of a bottom of the second trench, partially cover the first mask pattern on the third region, and expose a remaining part of the first mask pattern on the third region.

The first depth may be greater than the second depth. The first trench may have a greater width than the third trench, and the second trench may have a greater width than the third trench.

BRIEF DESCRIPTION OF THE DRAWINGS

Exemplary embodiments are described in further detail below with reference to the accompanying drawings. It should be understood that various aspects of the drawings may have been exaggerated for clarity.

DETAILED DESCRIPTION OF EXEMPLARY EMBODIMENTS

Figure 1:
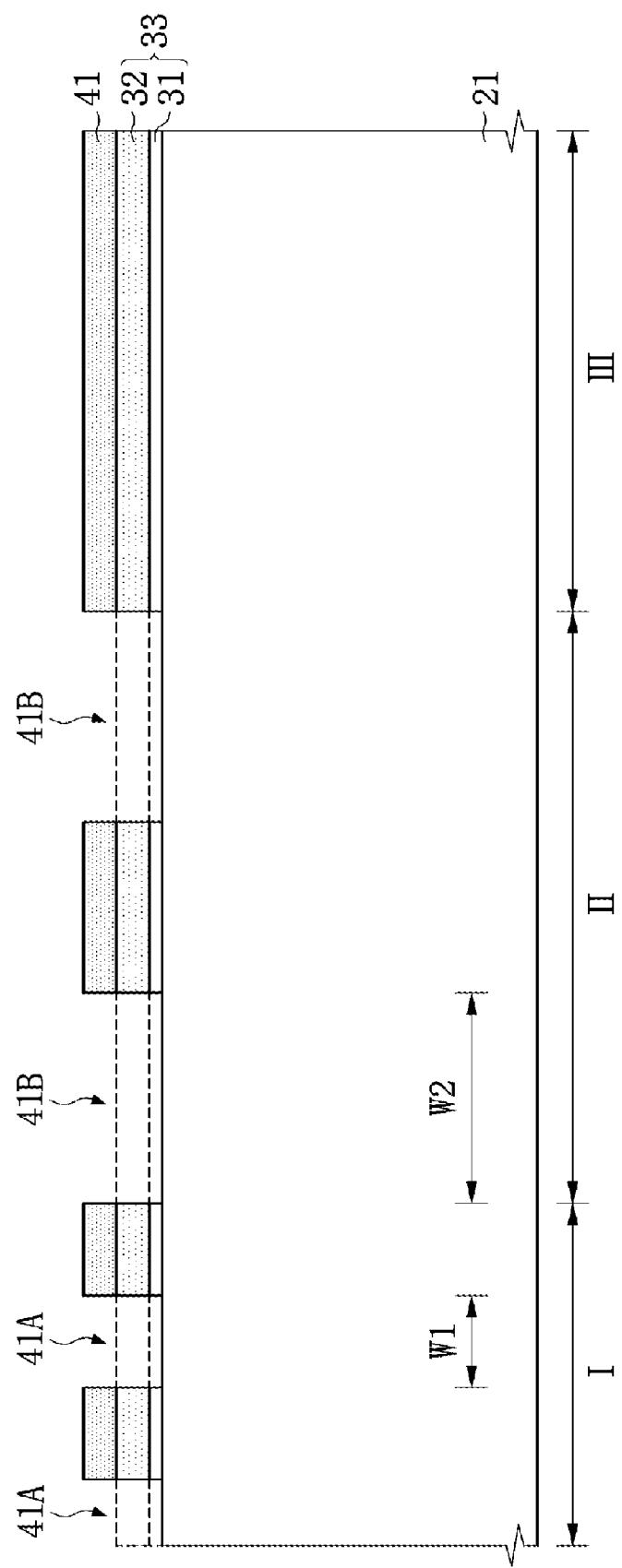
FIGS. 1 to 6 are cross-sectional views illustrating a method of forming an isolation structure according to a first exemplary embodiment.

Various exemplary embodiments of the present inventive concept will now be described more fully with reference to the accompanying drawings. The present inventive concept may, however, be embodied in different forms and should not be construed as limited to the exemplary embodiments set forth herein. Rather, these exemplary embodiments are provided so that this disclosure is thorough and complete and fully conveys the scope of the inventive concept to one skilled in the art. In the drawings, the thickness of layers and regions may be exaggerated for clarity. Also, when it is referred that a layer is "on" another layer or a substrate, it may be directly formed on another layer or the substrate or a third layer may be interposed therebetween. Like reference numerals designate like elements throughout the specification.

[First Example Embodiment]

FIGS. 1 to 6 are cross-sectional views illustrating a method of forming an isolation structure according to a first exemplary embodiment.

Referring to FIG. 1, a pad oxide layer 31 and a mask nitride layer 32 may be sequentially formed on a semiconductor substrate 21. A first photoresist pattern 41 may be formed on the mask nitride layer 32. The mask nitride layer 32 and the pad oxide layer 31 may be partially removed using the first photoresist pattern 41 as an etch mask to form a hard mask pattern 33. The first photoresist pattern 41 and the hard mask pattern 33 may include first and second openings 41A and 41B exposing a top surface of the semiconductor substrate 21.

The semiconductor substrate 21 may be a silicon wafer, a silicon-on-insulator (SOI) wafer or a compound semiconductor wafer. The semiconductor substrate 21 may include region I, region II, and region III. The region I may be a cell region, the region II may be a high-voltage region, and the region III may be a low-voltage region. The region II and the region III may be grouped into a peripheral circuit region. Locations of the region I, the region II, and the region III may be alternately repeated in the semiconductor substrate 21, and the sequence may be changed.

The pad oxide layer 31 may be a silicon oxide (SiO) layer such as a thermal oxide layer. The pad oxide layer 31 may be formed to a thickness of 5 nm to 20 nm. The pad oxide layer 31 may function to alleviate stress resulting from a difference in thermal expansion coefficient between the mask nitride layer 32 and the semiconductor substrate 21.

The mask nitride layer 32 may be formed of a material layer having an etch selectivity with respect to the pad oxide layer 31 and the semiconductor substrate 21. The mask nitride layer 32 may be formed of a silicon nitride (SiN) layer or a silicon oxynitride (SiON) layer by a chemical vapor deposition (CVD) method. The mask nitride layer 32 may be formed to a thickness of 40 nm to 300 nm.

After forming a photoresist layer covering the mask nitride layer 32, the first photoresist pattern 41 may be formed by a photolithography process. The photolithography process may include exposure and developing processes. The first openings 41A may be formed in the region I, and the second openings 41B may be formed in the region II. The first openings 41A may be formed to have a first width W1, and the second openings 41B may be formed to have a second width W2. The first width W1 may be smaller than the second width W2. That is, a pattern density of the region I may be higher than that of the region II. The region III may be entirely covered by the pad oxide layer 31 and the mask nitride layer 32.

In some exemplary embodiments, the pad oxide layer 31 may be omitted. In other exemplary embodiments, the mask nitride layer 32 may be omitted as well. In still other exemplary embodiments, the first photoresist pattern 41 may be in contact with the semiconductor substrate 21.

Figure 2:
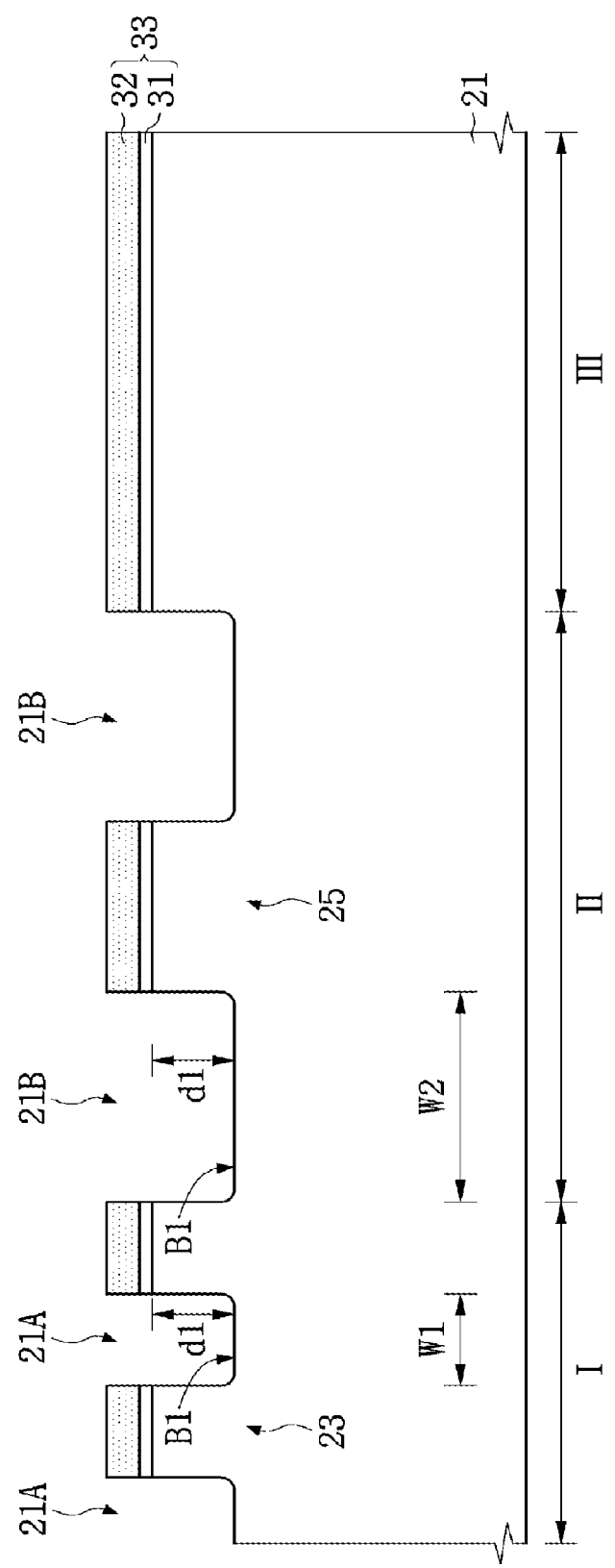

Referring to FIG. 2, the first photoresist pattern 41 may be removed to expose the hard mask pattern 33. The semiconductor substrate 21 may be partially removed using the hard mask pattern 33 as an etch mask to form first trenches 21A and second trenches 21B.

The first photoresist pattern 41 may be removed by an ashing process. The first trenches 21A and the second trenches 21B may be formed using an anisotropic etching technique such as dry etching. Widths of the first trenches 21A and the second trenches 21B may correspond to those of the first openings 41A and the second openings 41B in terms of size, respectively. For example, the first trenches 21A may be formed to have the first width W1, and the second trenches 21B may be formed to have the second width W2. While the first trenches 21A and the second trenches 21B may be formed in various shapes such as a reverse-trapezoid shape whose upper part has a greater width than a lower part or a trapezoid shape whose upper part has a smaller width than a lower part, it is described on the assumption that the upper part has the same width as the lower part for simplicity.

The first trenches 21A and the second trenches 21B may have first bottom surfaces B1. Also, the first trenches 21A and the second trenches 21B may be formed to have a first depth d1. First active regions 23 may be defined in the region I by the first trenches 21A, and second active regions 25 may be defined in the region II by the second trenches 21B. The first active regions 23 may be formed to have a smaller width than the second active regions 25. The first trenches 21A may exhibit a higher aspect ratio than the second trenches 21B. As a result, a pattern density of the region I may be higher than that of the region II.

The depths of the first trenches 21A and the second trenches 21B may have deviations resulting from a difference in etch rate corresponding to a pattern density. It will be interpreted that the depths of the first trenches 21A are substantially the same as those of the second trenches 21B for simplicity. Further, although the thickness of the hard mask pattern 33 may be reduced while the first trenches 21A and the second trenches 21B are formed, it is interpreted that it is negligible.

In some exemplary embodiments, the first photoresist pattern 41 may be removed after the first trenches 21A and the second trenches 21B are formed.

In other exemplary embodiments, while an anti-reflection layer may be additionally formed between the hard mask pattern 33 and the first photoresist pattern 41, the description thereof will be omitted for simplicity.

The formation of the first photoresist pattern 41, the hard mask pattern 33, the first trenches 21A and the second trenches 21B may correspond to a first patterning process.

Figure 3:
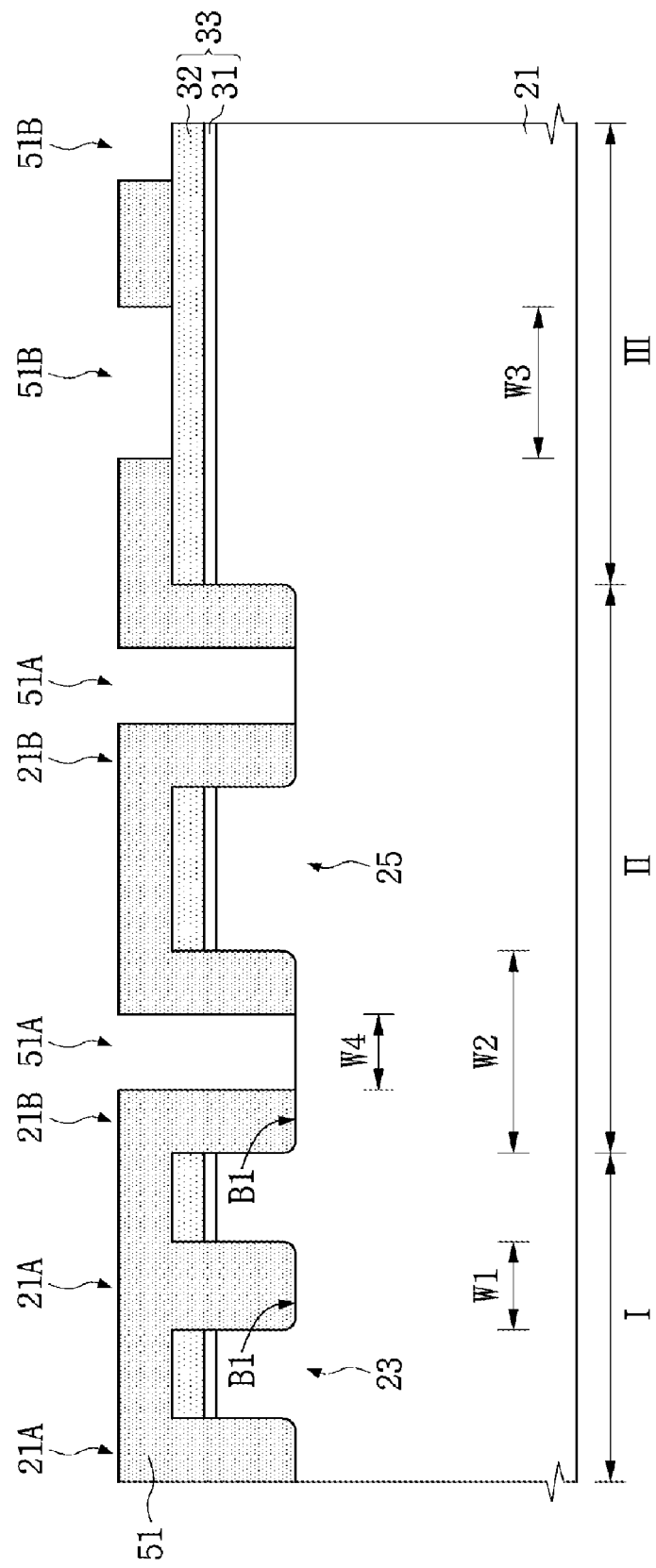

Referring to FIG. 3, a second photoresist pattern 51 may be formed on the semiconductor substrate 21 having the first trenches 21A and the second trenches 21B. The second photoresist pattern 51 may include third and fourth openings 51A and 51B.

The second photoresist pattern 51 may be formed by forming a photoresist layer covering the hard mask pattern 33, the first trenches 21A and the second trenches 21B, and performing a photolithography process. The photolithography process may include exposure and developing processes. The third openings 51A may be formed in the region II, and the fourth openings 51B may be formed in the region III. The fourth openings 51B may be formed to have a third width W3, and the third openings 51A may be formed to have a fourth width W4. The third width W3 may be greater than the first width W1 and smaller than the second width W2. The fourth width W4 may be smaller than the second width W2. That is, a pattern density of the region III may be higher than that of the region II and lower than that of the region I.

The hard mask pattern 33 may be exposed on bottoms of the fourth openings 51B. The first bottom surfaces B1 may be partially exposed on bottoms of the third openings 51A. That is, the first bottom surfaces B1 of the second trenches 21B may be partially covered by the second photoresist pattern 51. The third openings 51A may be formed in the second trenches 21B. The third openings 51A may be arranged in the center of the second trenches 21B.

The region I may be entirely covered by the second photoresist pattern 51. That is, the second photoresist pattern 51 may completely fill the first trenches 21A.

In some exemplary embodiments, the second photoresist pattern 51 may be formed of another mask pattern.

Figure 4:
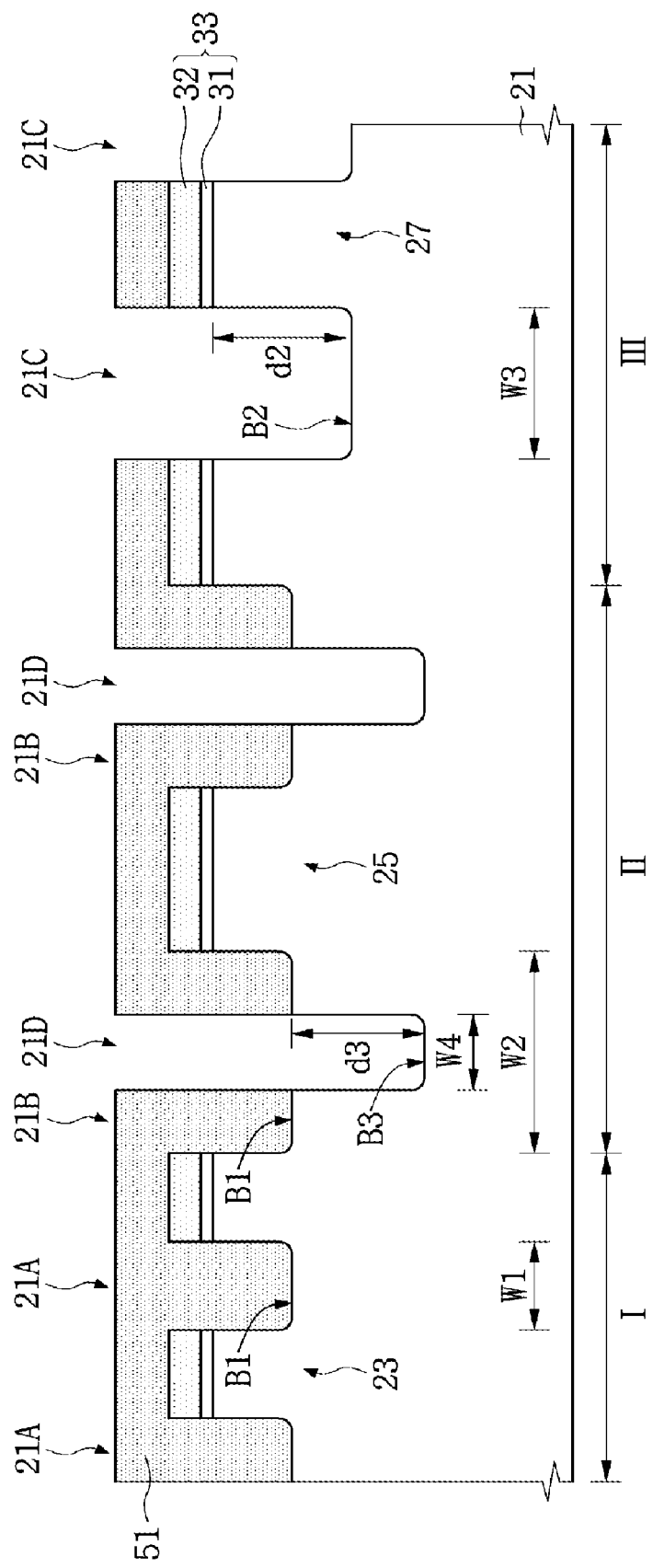

Referring to FIG. 4, the semiconductor substrate 21 may be partially removed using the second photoresist pattern 51 as an etch mask to form third trenches 21C and fourth trenches 21D.

The third trenches 21C may be formed by sequentially etching the hard mask pattern 33 and the semiconductor substrate 21. That is, the third trenches 21C may be formed by continuously performing a process of etching the hard mask pattern 33 and a process of etching the semiconductor substrate 21. The third trenches 21C may be formed using an anisotropic etching technique such as dry etching. Widths of the third trenches 21C may correspond to those of the fourth trenches 21D in terms of size. For example, the third trenches 21C may be formed to have the third width W3.

The third trenches 21C may be formed in the region III. Third active regions 27 may be defined in the region III by the third trenches 21C. The third trenches 21C may be formed to have a second depth d2. The second depth d2 may be greater than the first depth d1. The third trenches 21C may include second bottom surfaces B2. The second bottom surfaces B2 may be formed at a lower level than the first bottom surfaces B1.

While the third trenches 21C are formed, the fourth trenches 21D may be formed in the region II. The fourth trenches 21D may extend from bottoms of the second trenches 21B. The fourth trenches 21D may be arranged in the center of the second trenches 21B. Widths of the fourth trenches 21D may correspond to those of the third openings 51A in terms of size. For example, the fourth trenches 21D may be formed to have the fourth width W4. The fourth trenches 21D may be formed to have a third depth d3. The size of the third depth d3 may correspond to that of the second depth d2. For example, the third depth d3 may be substantially the same as the second depth d2.

As described above, the third trenches 21C may be formed by sequentially performing the process of etching the hard mask pattern 33 and the process of etching the semiconductor substrate 21. Here, while the hard mask pattern 33 is etched, the semiconductor substrate 21 exposed on the bottoms of the third openings 51A may be partially etched. Afterwards, while the semiconductor substrate 21 is etched to form the third trenches 21C, the semiconductor substrate 21 exposed on the bottoms of the third openings 51A may be etched again. In such a case, the third depth d3 may be greater than the second depth d2.

The fourth trenches 21D may include third bottom surfaces B3. The third bottom surfaces B3 may be formed at a lower level than the first bottom surfaces B1. Also, the third bottom surfaces B3 may be formed at a lower level than the second bottom surfaces B2.

Figure 5:
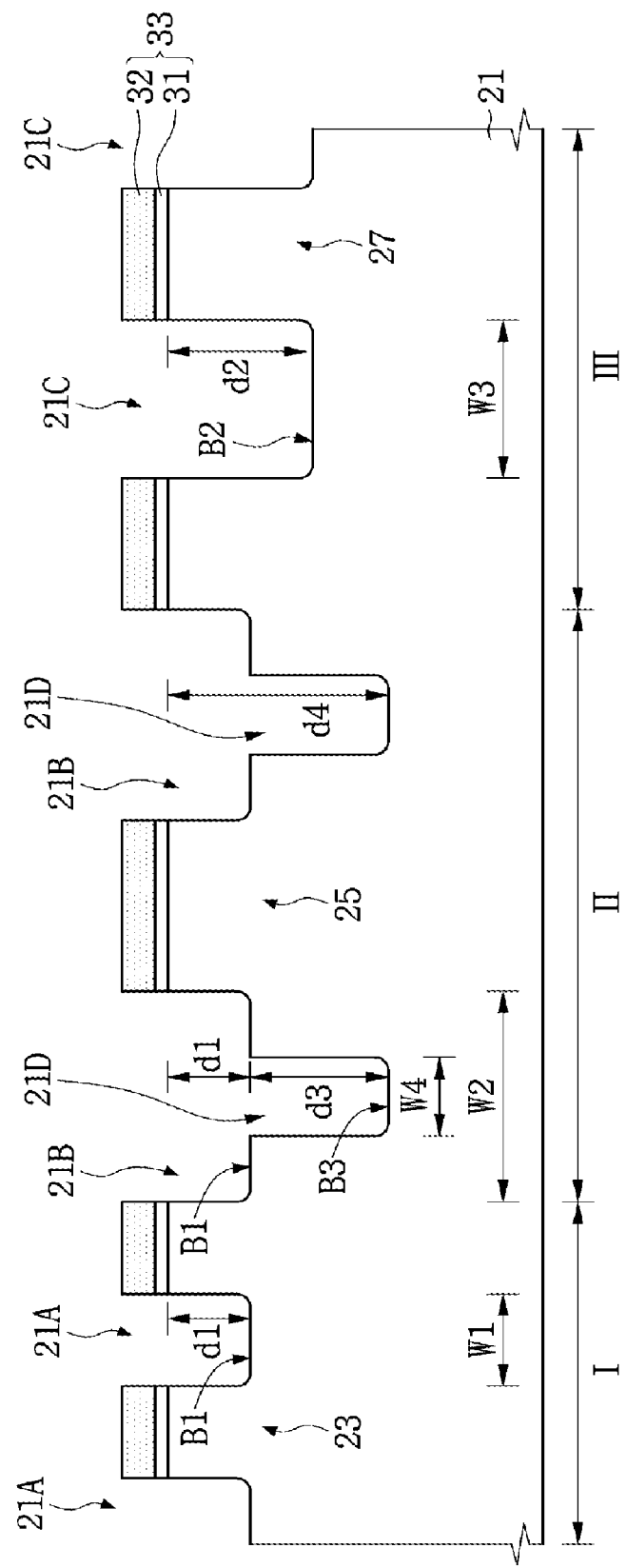

Referring to FIG. 5, the second photoresist pattern 51 may be removed to expose the hard mask pattern 33, the first trenches 21A, the second trenches 21B, the third trenches 21C and the fourth trenches 21D. The semiconductor substrate 21 may be exposed through the first trenches 21A, the second trenches 21B, the third trenches 21C, and the fourth trenches 21D.

The second photoresist pattern 51 may be removed using an ashing process. The formation of the second photoresist pattern 51, the third trenches 21C and the fourth trenches 21D may correspond to a second patterning process.

As a result, the first trenches 21A having the first depth d1, the first width W1, and the first bottom surfaces B1 may be formed in the region I. The second trenches 21B and the fourth trenches 21D extending from bottoms of the second trenches 21B may be formed in the region II. The second trenches 21B may have the first depth d1, the second width W2, and the first bottom surfaces B1. The fourth trenches 21D may have the third depth d3, the fourth width W4, and the third bottom surfaces B3. The third bottom surfaces B3 may exhibit a lower level than the first and second bottom surfaces B1 and B2. That is, a step difference may be provided between the first bottom surfaces B1 of the second trenches 21B and the third bottom surfaces B3 of the fourth trenches 21D of the region II. Also, trenches 21D having a fourth depth d4 corresponding to the sum of the first depth d1 and the third depth d3 may be provided in the region II.

The third trenches 21C having the second depth d2, the third width W3 and the second bottom surfaces B2 may be formed in the region III. The third width W3 may be greater than the first width W1 and smaller than the second width W2. The fourth width W4 may be smaller than the second width W2.

According to the first exemplary embodiment, the first patterning process and the second patterning process may be employed to form the first trenches 21A having the first bottom surfaces B1, the fourth trenches 21D having the third bottom surfaces B3, and the third trenches 21C having the second bottom surfaces B2 may be formed in the semiconductor substrate 21. The first bottom surfaces B1 may be provided at a higher level than the second bottom surfaces B2, and the third bottom surfaces B3 may be provided at a lower level than the second bottom surfaces B2. That is, trenches having three different depths may be formed only by performing a patterning process twice.

Figure 6:
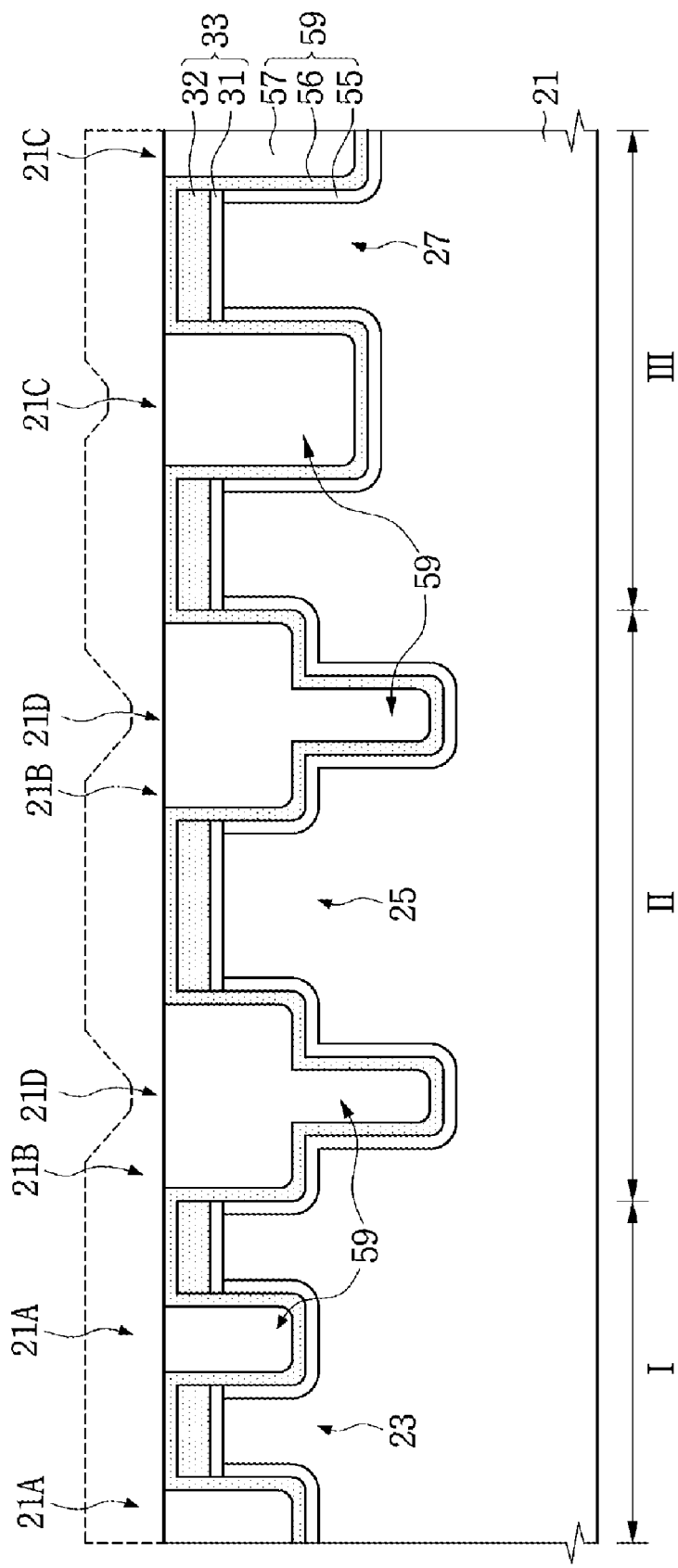

Referring to FIG. 6, an isolation layer 59 filling the first trenches 21A, the second trenches 21B, the third trenches 21C and the fourth trenches 21D may be formed. The isolation layer 59 may be formed by sequentially stacking an oxide film liner 55, a nitride film liner 56 and a gap fill insulating layer 57.

The oxide liner 55 may be formed of a SiO layer such as a thermal oxide layer. In such a case, the oxide film liner 55 may be formed along inner walls of the first trenches 21A, the second trenches 21B, the third trenches 21C and the fourth trenches 21D. That is, the oxide film liner 55 may be in contact with the semiconductor substrate 21. The oxide film liner 55 may function to recover defects that are formed in the semiconductor substrate 21, while the first trenches 21A, the second trenches 21B, the third trenches 21C and the fourth trenches 21D are formed.

The nitride film liner 56 may be formed of a silicon nitride (SiN) layer or a silicon oxynitride (SiON) layer by a chemical vapor deposition (CVD) method. The nitride film liner 56 may cover the oxide film liner 55 and the hard mask pattern 33. The oxide film liner 55 may be interposed between the semiconductor substrate 21 and the nitride film liner 56. The oxide film liner 55 and the nitride film liner 56 may have very uniform thicknesses on the entire surface of the semiconductor substrate 21. Further, the oxide film liner 55 and the nitride film liner 56 may be formed along the surface of the semiconductor substrate 21.

The gap fill insulating layer 57 may be formed of one selected from the group consisting of a SiO layer, a SiN layer, a SiON layer, and a combination thereof. For example, the gap fill insulating layer 57 may be formed of HDP oxide, SOG, or BPSG. The gap fill insulating layer 57 may completely fill the first trenches 21A, the second trenches 21B, the third trenches 21C and the fourth trenches 21D. The gap fill insulating layer 57 may include a planarized top surface. The gap fill insulating layer 57 may be planarized using a CMP process or an etch-back process. Top surfaces of the gap fill insulating layer 57 and the nitride film liner 56 may be exposed on the same plane. Alternatively, the hard mask pattern 33 may be completely removed. In such a case, the top surface of the semiconductor substrate 21 may be exposed through the isolation layer 59.

According to the first exemplary embodiment, the isolation layer 59 may be formed to have different depths in the regions I, II, and III. The region I may be a cell region, the region II may be a high-voltage region, and the region III may be a low-voltage region. The low-voltage region may be a region that requires a higher operating voltage than the cell region and a lower operating voltage than the high-voltage region. In such a case, in the region II, the isolation layer 59 may be formed thicker than that in the region I. Moreover, in the region III, the isolation layer 59 may be formed thicker than that in the region I, and may be formed thinner than that in the region II.

[Second Example Embodiment]

FIGS. 7 to 10 are cross-sectional views illustrating a method of forming an isolation structure according to a second exemplary embodiment.

Figure 7:
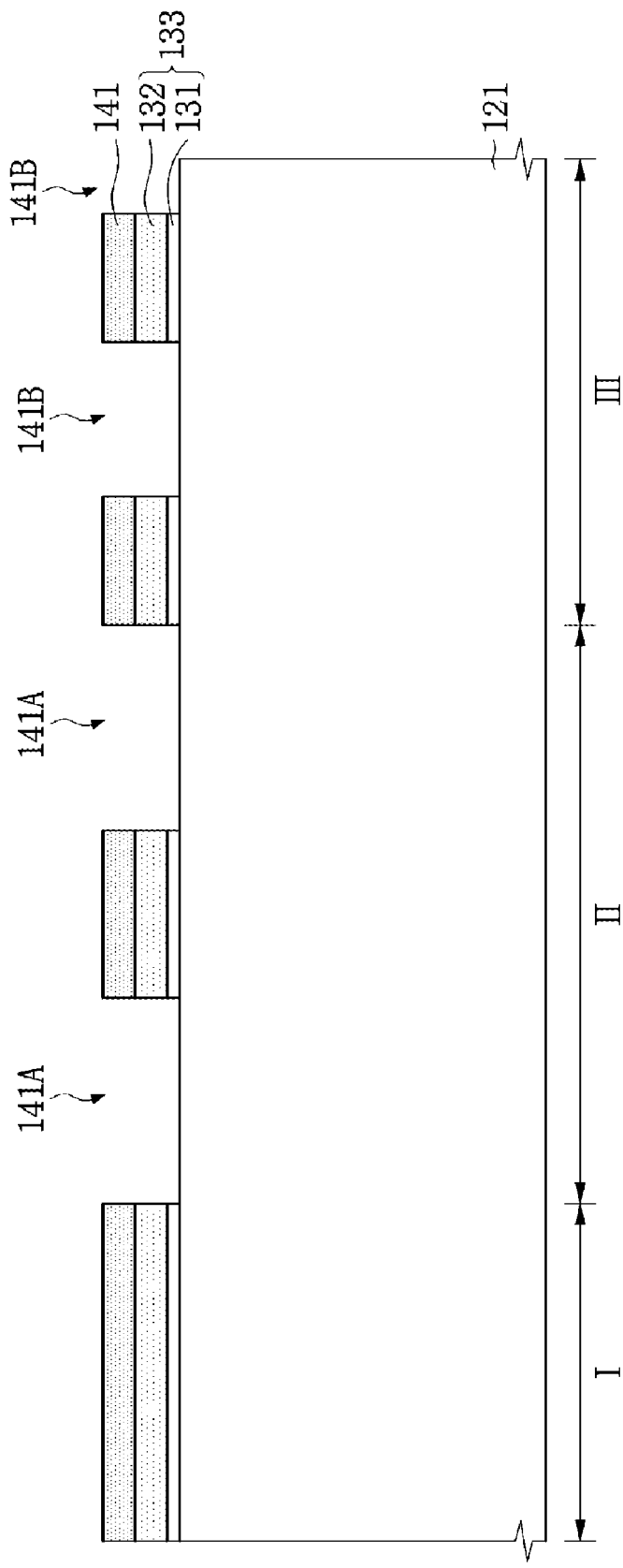
FIGS. 7 to 10 are cross-sectional views illustrating a method of forming an isolation structure according to a second exemplary embodiment.

Referring to FIG. 7, a pad oxide layer 131 and a mask nitride layer 132 may be sequentially formed on a semiconductor substrate 121. A first photoresist pattern 141 may be formed on the mask nitride layer 132. The mask nitride layer 132 and the pad oxide layer 131 may be partially removed using the first photoresist pattern 141 as an etch mask to form a hard mask pattern 133. The first photoresist pattern 141 and the hard mask pattern 133 may include first and second openings 141A and 141B exposing a top surface of the semiconductor substrate 121.

The semiconductor substrate 121 may be divided into region I, region II, and region III. The region I may be a cell region, the region II may be a high-voltage region, and the region III may be a low-voltage region. Locations of the regions I, II and III may be alternately repeated in the semiconductor substrate 121, and the sequence may be changed.

The pad oxide layer 131 may be formed of a SiO layer such as a thermal oxide layer. The pad oxide layer 131 may be formed to a thickness of 5 nm to 20 nm. The pad oxide layer 131 may function to alleviate stress resulting from a difference in thermal expansion coefficient between the mask nitride layer 132 and the semiconductor substrate 121.

The mask nitride layer 132 may be formed of a material having an etch selectivity with respect to the pad oxide layer 131 and the semiconductor substrate 121. The mask nitride layer 132 may be formed of a SiN layer or a SiON layer by a CVD method. The mask nitride layer 132 may be formed to a thickness of 40 nm to 300 nm.

The first photoresist pattern 141 may be formed by forming a photoresist layer covering the mask nitride layer 132, and then performing a photolithography process. The first openings 141A may be formed in the region II, and the second openings 141B may be formed in the region III. The first openings 141A may be formed to have a greater width than the second openings 141B. The region I may be completely covered by the pad oxide layer 131 and the mask nitride layer 132.

In some exemplary embodiments, the pad oxide layer 131 may be omitted. In other exemplary embodiments, the mask nitride layer 132 may be omitted as well. In still other exemplary embodiments, the first photoresist pattern 141 may be in contact with the semiconductor substrate 121.

Figure 8:
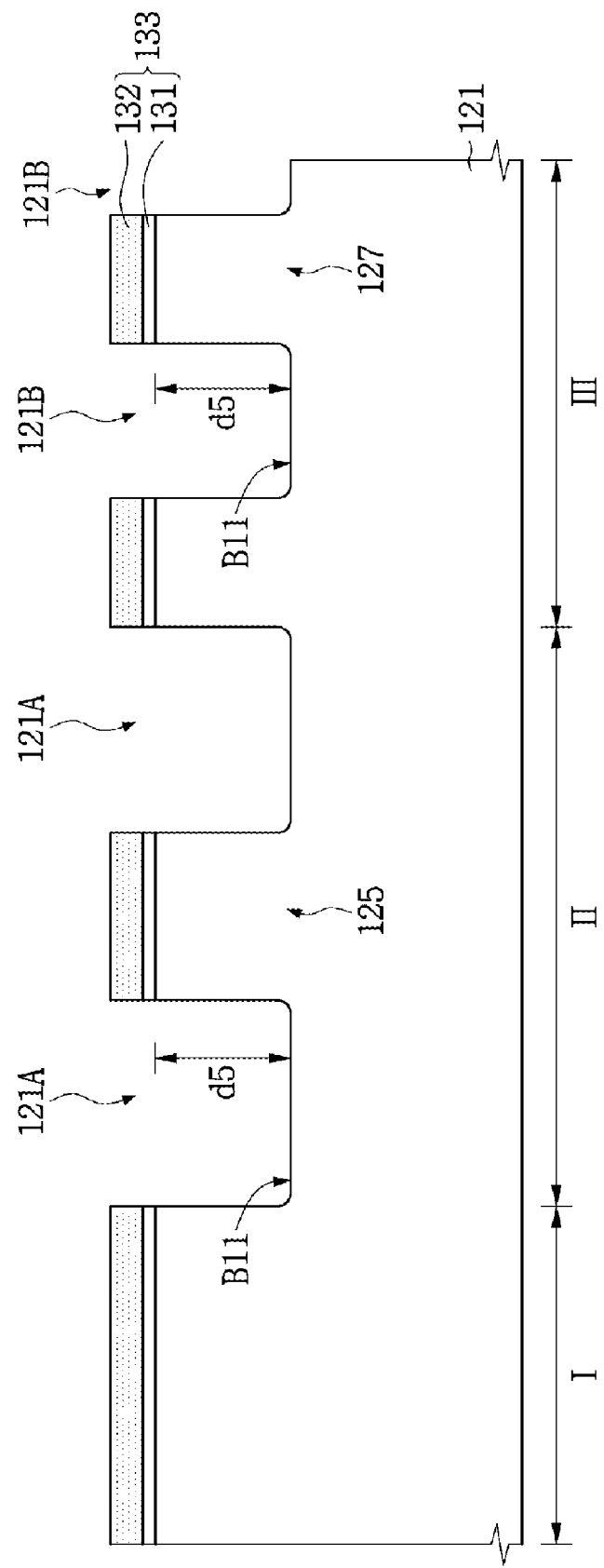

Referring to FIG. 8, the first photoresist pattern 141 may be removed to expose the hard mask pattern 133. The semiconductor substrate 121 may be partially removed using the hard mask pattern 133 as an etch mask to form first trenches 121A and second trenches 121B.

The first photoresist pattern 141 may be removed using an ashing process. The first trenches 121A and the second trenches 121B may be formed by an anisotropic process such as a dry etching. Widths of the first trenches 121A and the second trenches 121B may correspond to those of the first openings 141A and the second openings 141B in terms of size. It will be described on the assumption that upper parts of the first openings 141A and the second openings 141B have the same width as lower parts for simplicity.

The first trenches 121A and the second trenches 121B may have first bottom surfaces B11. Also, the first trenches 121A and the second trenches 121B may be formed to have a first depth d5. First active regions 125 may be defined in the region II by the first trenches 121A, and second active regions 127 may be defined in the region III by the second trenches 121B.

The depths of the first trenches 121A and the second trenches 121B may have deviations resulting from a difference in etch rate corresponding to a pattern density. It will be interpreted that the depth of the first trenches 121A is substantially the same as that of the second trenches 121B for simplicity.

In other exemplary embodiments, the first photoresist pattern 141 may be removed after the first trenches 121A and the second trenches 121B are formed.

The formation of the first photoresist pattern 141, the hard mask pattern 133, the first trenches 121A and the second trenches 121B may correspond to a first patterning process.

Figure 9:
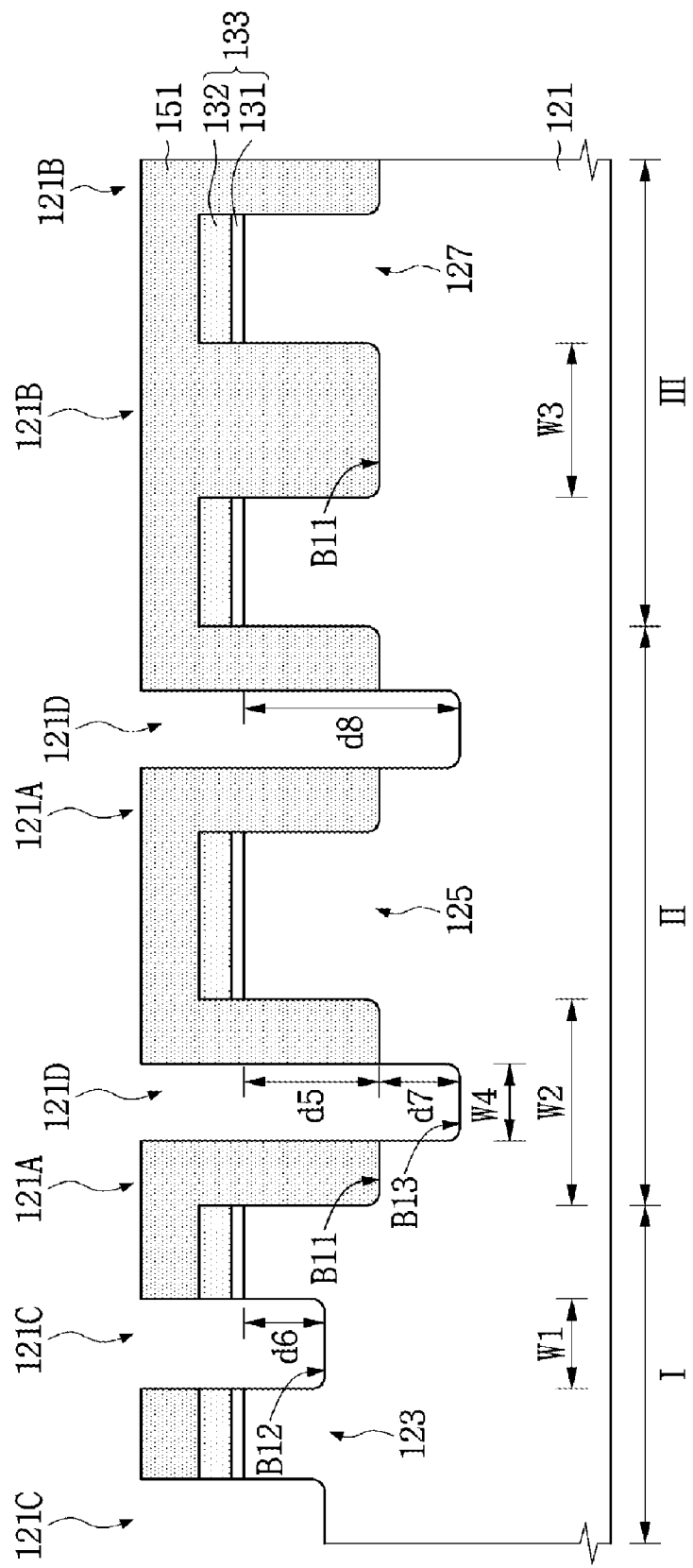

Referring to FIG. 9, a second photoresist pattern 151 may be formed on the semiconductor substrate 121 having the first trenches 121A and the second trenches 121B.

The second photoresist pattern 151 may be formed by forming a photoresist layer covering the hard mask pattern 133, the first trenches 121A and the second trenches 121B, and then performing a photolithography process. The region III may be completely covered by the second photoresist pattern 151. That is, the second photoresist pattern 151 may fully fill the second trenches 121B.

The second photoresist pattern 151 may include openings partially exposing the region I and the region II. The first bottom surfaces B11 of the first trenches 121A may be partially covered by the second photoresist pattern 151. Further, the first bottom surfaces B11 of the first trenches 121A may be partially exposed.

The semiconductor substrate 121 may be partially removed using the second photoresist pattern 151 as an etch mask to form third trenches 121C and fourth trenches 121D.

The third trenches 121C may be formed by sequentially etching the hard mask pattern 133 and the semiconductor substrate 121. The third trenches 121C may be formed using an anisotropic etching technique such as dry etching. The third trenches 121C may be formed to have a first width W1.

The third trenches 121C may be formed in the region I. Third active regions 123 may be defined in the region I by the third trenches 121C. The third trenches 121C may be formed to have a second depth d6. The second depth d6 may be smaller than the first depth d5. The third trenches 121C may include second bottom surfaces B12. The second bottom surfaces B12 may be formed at a higher level than the first bottom surfaces B11.

The fourth trenches 121D may be formed in the region II while the third trenches 121C are formed. The fourth trenches 121D may extend from bottoms of the first trenches 121A. The first trenches 121A may be formed to have a second width W2. The second trenches 121B may be formed to have a third width W3. The fourth trenches 121D may be formed to have a fourth width W4.

The fourth trenches 121D may be formed to have a third depth d7. The size of the third depth d7 may correspond to that of the second depth d6. For example, the third depth d7 may be substantially the same as the second depth d6. The fourth trenches 121D may have third bottom surfaces B13. The third bottom surfaces B13 may be formed at a lower level than the first bottom surfaces B11.

As described above, the third trenches 121C may be formed by serially performing the process of etching the hard mask pattern 133 and the process of etching the semiconductor substrate 121. Here, the first bottom surfaces B11 may be partially etched while the hard mask pattern 133 is etched. Sequentially, while the semiconductor substrate 121 is etched to form the third trenches 121C, the semiconductor substrate 121 exposed on the first bottom surfaces B11 may be etched again. In such a case, the third depth d7 may be greater than the second depth d6.

The second photoresist pattern 151 may be removed, so that the hard mask pattern 133, the first trenches 121A, the second trenches 121B, the third trenches 121C and the fourth trenches 121D can be exposed.

The second photoresist pattern 151 may be removed using an ashing process. The formation of the second photoresist pattern 151, the third trenches 121C and the fourth trenches 121D may correspond to a second patterning process.

As a result, the third trenches 121C having the second depth d6, the first width W1, and the second bottom surfaces B12 may be formed in the region I. The first trenches 121A and the fourth trenches 121D extending from the bottoms of the first trenches 121A may be formed in the region II. The first trenches 121A may have the first depth d5, the second width W2, and the first bottom surfaces B11. The fourth trenches 121D may have the third depth d7, the fourth width W4 and the third bottom surfaces B13. The third bottom surfaces B13 may exhibit a lower level than the first bottom surfaces B11 and the second bottom surfaces B12. That is, a step difference may be provided between the first bottom surfaces B11 of the first trenches 121A and the third bottom surfaces B13 of the fourth trenches 121D in the region II. Moreover, trenches 121A and 121D having a fourth depth d8 corresponding to the sum of the first depth d5 and the third depth d7 may be provided in the region II.

The second trenches 121B having the first depth d5, the third width W3, and the first bottom surfaces B11 may be formed in the region III. The third width W3 may be greater than the first width W1 and smaller than the second width W2. The fourth width W4 may be smaller than the second width W2.

According to the second exemplary embodiment, the second trenches 121B having the first bottom surfaces B11, the fourth trenches 121D having the third bottom surfaces B13, and the third trenched 121C having the second bottom surfaces B12 may be formed in the semiconductor substrate 121 using the first patterning process and the second patterning process. The first bottom surfaces B11 may be provided at a lower level than the second bottom surfaces B12, and the third bottom surfaces B13 may be provided at a lower level than the first bottom surfaces B11. That is, the trenches having three different depths may be formed only by performing a patterning process twice.

Figure 10:
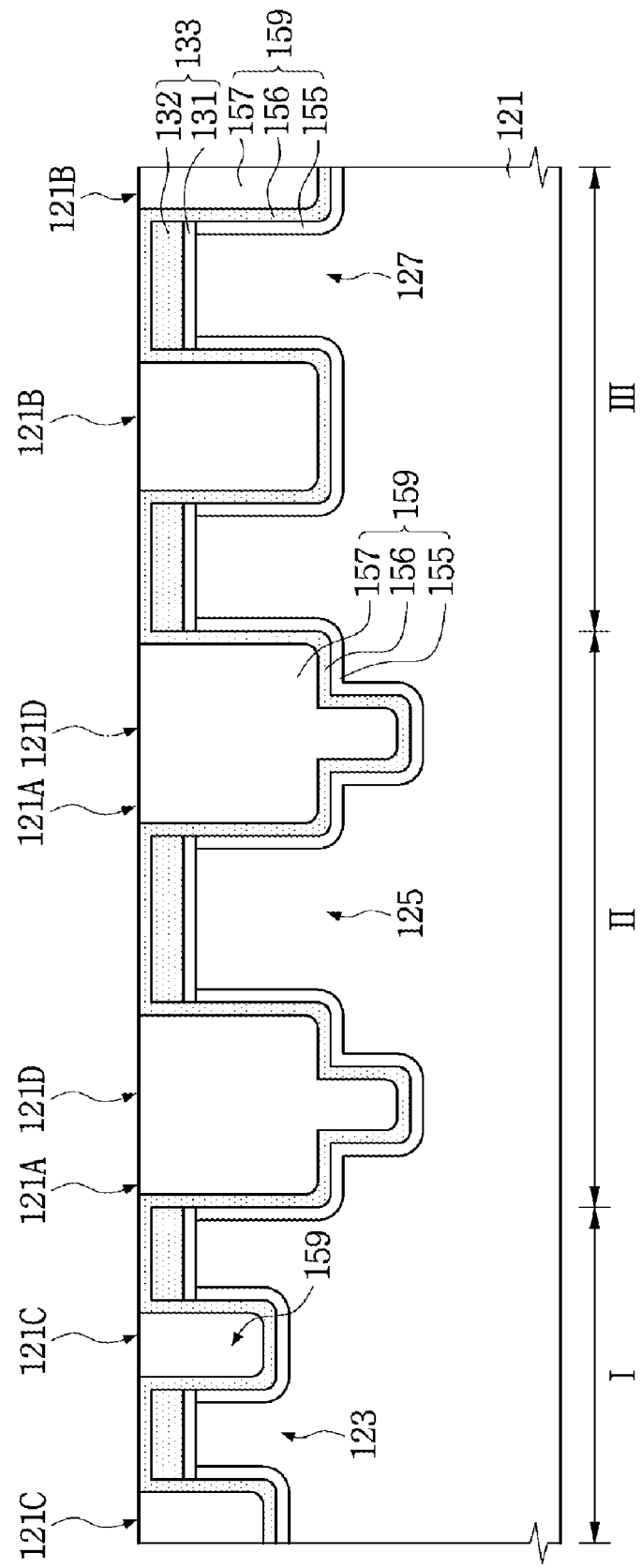

Referring to FIG. 10, an isolation layer 159 filling the first trenches 121A, the second trenches 121B, the third trenches 121C and the fourth trenches 121D may be formed. The isolation layer 159 may be formed by sequentially stacking an oxide film liner 155, a nitride film liner 156 and a gap fill insulating layer 157.

The oxide liner 155 may be formed of a SiO layer such as a thermal oxide layer. In such a case, the oxide film liner 155 may be formed along inner walls of the first trenches 121A, the second trenches 121B, the third trenches 121C and the fourth trenches 121D.

The nitride film liner 156 may be formed of a SiN layer or a SiON layer by a CVD method. The nitride film liner 156 may cover the oxide film liner 155 and the hard mask pattern 133.

The gap fill insulating layer 157 may be formed of one selected from the group consisting of a SiO layer, a SiN layer, a SiON layer, and a combination thereof. The gap fill insulating layer 157 may include a planarized top surface. The gap fill insulating layer 157 may completely fill the first trenches 121A, the second trenches 121B, the third trenches 121C and the fourth trenches 121D. For example, the gap fill insulating layer 157 may be formed of HDP oxide, SOG, or BPSG.

According to exemplary embodiments, a first patterning process and a second patterning process can be used to form first to fourth trenches in a semiconductor substrate. The fourth trenches can extend from bottoms of the second trenches. That is, trenches having three different depths can be formed only by performing a patterning process twice. An isolation layer filling the first to fourth trenches can be formed. As a result, an isolation structure of a semiconductor device capable of reducing the number of patterning processes and having various depths can be implemented.

While exemplary embodiments have been disclosed herein, it should be understood that other variations may be possible. Such variations are not to be regarded as a departure from the spirit and scope of exemplary embodiments of the present application, and all such modifications as would be obvious to one skilled in the art are intended to be included within the scope of the following claims.

What is claimed is:

1. A method of forming an isolation structure, comprising:
providing a semiconductor substrate comprising a first region, a second region, and a third region;
performing a first patterning process of etching the semiconductor substrate to form at least one first trench in the first region and at least one second trench in the second region, wherein the first and second trenches have a same first depth measured with respect to bottommost surfaces of the first and second trenches, respectively;
performing a second patterning process of etching the semiconductor substrate to form at least one third trench in the third region and at least one fourth trench in the second region, wherein the fourth trench extends from the bottommost surface of the second trench, the third trench has a second depth measured with respect to a bottommost surface of the third trench, and the fourth trench has a third depth measured with respect to a bottommost surface of the fourth trench; and
forming an isolation layer filling the first to fourth trenches, wherein the first and second depths are different from each other.

2. The method of claim 1, wherein the bottommost surface of the second trench and the bottommost surface of the fourth trench form a step difference.

3. The method of claim 2, wherein the bottommost surface of the fourth trench is formed at a lower level than the bottommost surfaces of the first and third trenches.

4. The method of claim 1, wherein the first depth is smaller than the second depth.

5. The method of claim 4, wherein the first trench has a smaller width than the third trench, and the second trench has a greater width than the first trench.

6. The method of claim 1, wherein the first patterning process comprises:
forming a first mask pattern on the semiconductor substrate; and
etching the semiconductor substrate using the first mask pattern as an etch mask.

7. A method of forming an isolation structure, comprising:
providing a semiconductor substrate comprising a first region, a second region, and a third region;
performing a first patterning process of etching the semiconductor substrate to form at least one first trench in the first region and at least one second trench in the second region, wherein the first and second trenches have a first depth;
performing a second patterning process of etching the semiconductor substrate to form at least one third trench in the third region and at least one fourth trench in the second region, wherein the fourth trench extends from a bottom of the second trench, the third trench has a second depth, and the fourth trench has a third depth; and
forming an isolation layer filling the first to fourth trenches, wherein the first and second depths are different from each other, wherein the second patterning process comprises:
forming a second mask pattern on the semiconductor substrate such that the second mask pattern entirely covers the first trench, partially covers the second trench, exposes a part of a bottom of the second trench, partially covers the first mask pattern on the third region, and exposes a remaining part of the first mask pattern on the third region; and
etching the semiconductor substrate using the second mask pattern as an etch mask.

8. The method of claim 7, wherein the etching the semiconductor substrate using the second mask pattern as an etch mask comprises etching the first mask pattern on the third region and the semiconductor substrate below the first mask pattern on the third region to form the third trench.

9. The method of claim 8, wherein while the first mask pattern on the third region is etched, the part of the bottom of the second trench is partially etched, and, afterwards, while the semiconductor substrate below the first mask pattern on the third region is etched to form the third trench, the etched part of the bottom of the second trench is etched, whereby a third depth less the first depth made in the fourth trench is greater than the second depth of the third trench.

10. The method of claim 6, wherein the first mask pattern is formed by sequentially stacking a pad oxide layer and a mask nitride layer.

11. The method of claim 1, wherein the second patterning process comprises:
forming a mask pattern on the semiconductor substrate such that the mask pattern entirely covers the first trench, partially covers the second trench, exposes a part of the bottom surface of the second trench, partially covers the mask pattern on the third region, and exposes a remaining part of the mask pattern on the third region; and
etching the semiconductor substrate using the mask pattern as an etch mask.

12. The method of claim 1, wherein the first depth is greater than the second depth.

13. The method of claim 12, wherein the first trench has a smaller width than the third trench, and the second trench has a greater width than the third trench.

14. The method of claim 1, wherein the first and second trenches are formed in the first and second regions, respectively, by etching a planar surface of the semiconductor substrate at one time, and
wherein the third and fourth trenches are formed in the third and second regions by etching the planar surface of the semiconductor substrate and the bottommost surface of the second trench at one time.

* * * * *